United States Patent [19]

Christiansen et al.

[11] 4,335,465
[45] Jun. 15, 1982

[54] METHOD OF PRODUCING AN ACCELERATING ELECTRONS AND IONS UNDER APPLICATION OF VOLTAGE AND ARRANGEMENTS CONNECTED THEREWITH

[76] Inventors: Jens Christiansen, An den Hornwiesen 4, 8521 Erlangen-Buckenhof; Christoph Schultheiss, Schleifweg 19, 8521 Erlangen-Uttenreuth, both of Fed. Rep. of Germany

[21] Appl. No.: 8,162

[22] Filed: Jan. 31, 1979

[30] Foreign Application Priority Data

Feb. 2, 1978 [DE] Fed. Rep. of Germany ....... 2804393

[51] Int. Cl.³ .......................... G21G 1/06; H01J 17/00
[52] U.S. Cl. ..................... 376/156; 376/429; 60/203.1; 313/195; 313/360.1
[58] Field of Search ........................ 176/5–9; 313/195, 360, 362; 328/233, 237; 60/203

[56] References Cited

U.S. PATENT DOCUMENTS

| | | | |
|---|---|---|---|
| 2,145,727 | 1/1939 | Lloyd | 313/360 |
| 2,272,374 | 2/1942 | Kallmann et al. | 313/360 |
| 2,504,231 | 4/1950 | Smith | 313/195 |
| 2,538,267 | 1/1951 | Pierce | 313/195 |
| 2,569,154 | 9/1951 | Donath | 313/195 |
| 2,880,337 | 3/1959 | Langmuir et al. | 313/195 |
| 2,992,345 | 7/1961 | Hansen | 176/5 |
| 3,014,154 | 12/1961 | Ehlers et al. | 313/360 |
| 3,305,448 | 2/1967 | Becker et al. | 176/5 |
| 3,382,402 | 5/1968 | Lafferty | 313/195 |
| 3,421,035 | 1/1969 | Brubaker | 313/360 |
| 3,501,376 | 3/1970 | Dow et al. | 176/5 |
| 3,519,942 | 7/1970 | Mobley | 176/5 |
| 3,846,668 | 11/1974 | Ehlers et al. | 313/360 |
| 4,076,993 | 2/1978 | Nowak | 313/362 |

OTHER PUBLICATIONS

Solar Magnetic Fields, pp. 512-525 (1971) Bostick et al., Reidel Pub. Co., Pordrecht, Holland.

*Primary Examiner*—Sal Cangialosi
*Attorney, Agent, or Firm*—Holman & Stern

[57] ABSTRACT

An electron and ion accelerator includes plural spaced electrodes which are apertured to define a gas discharge path and supported at their peripheries by insulative means. A gas supply provides low pressure gas capable of producing electrons and ions in the gas discharge path. A voltage applied between the at least two electrodes establishes an electrical potential between them such that a spark-like gas discharge occurs along the gas discharge path. The current density obtainable in the low pressure gas is substantially higher than the density of an electron or ion flow in a vacuum.

23 Claims, 12 Drawing Figures

METHOD OF PRODUCING AN ACCELLERATING ELECTRONS AND IONS UNDER APPLICATION OF VOLTAGE AND ARRANGEMENTS CONNECTED THEREWITH

BACKGROUND OF THE INVENTION

The present invention concerns firstly a method for producing and accelerating electrons and ions under application of a voltage, whereby electrodes are proposed which, under the influence of a voltage, supply electrons, and a gas being proposed which, under low pressure, supplies electrons and ions. It is known in the art to produce electron flows in a vacuum by means of thermionic emission or by point discharges, and to consequently accelerate in a corresponding voltage field. The current densities which are thereby obtainable are insufficient. In the prior art, electrons which were produced in a vacuum have been deposited through a thin foil into a chamber in which is located a gas which is under low pressure. Eventhough it is possible to thus obtain in this low-pressure area electron flows having a high current density, however, the amount of instruments required is very high and the effect is unsatisfactory.

SUMMARY OF THE INVENTION

It is the scope of the present invention to provide not only a method but also a particle-accelerator and arrangements formed therewith, which, at a substantially higher effectiveness, produce an electron flow and in given cases also an electron flow of a very high current density with comparatively simple instruments.

The present invention utilizes a method of the above-mentioned species of the invention, with electrodes which are located at a distance apart from one another and are screened outwardly. At least one gas discharge channel is provided, which is formed of aligned openings of at least the inner electrodes. Within the electrodes provision is made for an ionisable low pressure gas to be placed, and for the electrodes to be connected to a voltage of a strength so that it substantially collapses in a spark-like gas-discharge. One obtains thereby a controlled spark penetration, which may also be characterized as a "pseudo-spark". The current density which is obtainable in the low pressure gas is substantially higher than the density of an electron- or ion-flow in the vacuum. The low-pressure spark-discharge which is obtainable by means of the present invention is stable and reproducable. While in many methods for producing an electron- or ion-flow the effectiveness lies in the area of 0.1 to 1%, an effectiveness of 30% and higher can be obtained with the present invention. In comparison with the common spark penetrations, however, the developing sporadic process of the spark-channel and the developing contraction in the actual discharge-path in the gas chamber is prevented, in so far as the inside pressure between the electrodes is maintained correspondingly low. The difference from a vacuum which differs in its pressure from a low pressure by multiple ten percent should be noted. While, for example, with the present invention at an electrode-distance of one millimeter there resulted a preferred low pressure value of 0.5 mbar, the pressures of a vacuum are in the area of $10^{-3}$ to $10^{-4}$. In contrast to the vacuum-discharge, the low-pressure gas content in the instant invention has an active function.

The above-noted effects, or advantages, are produced in that the low pressure gas-discharge is made not at the outside edge of the electrodes but in the gas-discharge channel. The discharge is localized there. In this low pressure electrode system under application of a voltage there develops the tendency of transition in a type spark-discharge and simultaneously the localization of this discharge in the area of the discharge channel.

In a preferred embodiment of the present invention which is not limited to the aforesaid, it is proposed that the product $p \times d$ be located in the size arrangement of 0.05 to 0.5 mbar $\times$ mm. Thereby, p represents the inside pressure between the electrodes in mbar, and d represents the distance in mm between the individual electrodes. Additional embodiments of the present invention are explained in more detail in the special description of the drawings.

The present invention further concerns a particle accelerator for performing the above-mentioned method and proposes in this regard at least two electrodes at equidistance; that at least the inner electrodes have each an opening, whereby associated openings of electrodes are along one line and forming the gas discharge channel; that the outer surfaces or outer edges of the electrodes are enclosed by an insulating housing, and that means for gas-supply and, if required, for producing the low pressure necessary inside the electrodes, are provided. Such a particle accelerator may be manufactured with a relatively low constructive expenditure and therefore at comparatively low costs. It distinguishes itself, however by the afore-mentioned high efficiency. In toto, a very efficient production of electron- or ion-flows is obtained.

According to the embodiments of the present invention, outflow-openings may be provided at one end or at both ends of the gas-discharge channel for the accelerated electrical particles. In special cases of application, it would also be possible not to provide for any outflow-openings.

BRIEF DESCRIPTION OF THE DRAWINGS

The present invention proposes additionally embodiments and applicabilities as well as advantages of such a particle accelerator. These and further characteristics, as well as advantages of the present invention may be noted from the following description of multiple embodiments of the invention, and the associated drawings, wherein.

DETAILED DESCRIPTION OF A PREFERRED EMBODIMENT

Figure 1:
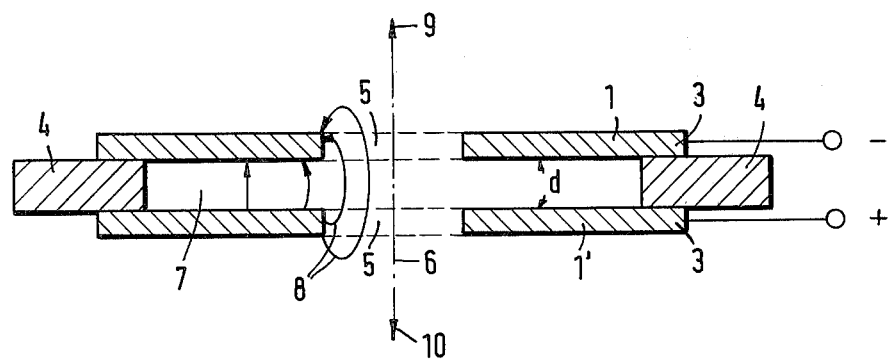
FIG. 1 is a cross-sectional view showing the basic principle of a particle accelerator according to the invention.

FIG. 1 shows the basic principle of the present invention with two planar-parallel and, for example, circular electrodes 1, 1', to which are applied a voltage U. In order to prevent any spark-over in the area of the recess edges 3 of the electrodes, they are at that point separated from one another by means of an insulation 4, for example a rotating annular disc comprising an insulating material. Each electrode is provided with a hole or a borehole 5, which are aligned and forming the gas discharge channel, having a concentric axis 6 which runs at right angles to the plane of the electrode. The shape of the boreholes may be round, square or in slot-shape. The boreholes 5 and the inner chamber 7 between the electrodes are provided with an ionisable low pressure gas which in a preferred embodiment is hydrogen gas. In general, reference is here made to the embodiments described hereinbelow. It has now been established that with a predetermined voltage value U there develops a spark-like gas-discharge according to the lines 8. There is given the following equation:

$$U \sim 1/(p \cdot d)^3$$

whereby p represents the pressure in the inner chamber 7 and d represents the distance between of the two electrodes. In an arrangement of more than two electrodes (for example FIG. 2) d represents approximately the distance of the individual electrodes from each other, and U represents the voltage between these two electrodes. As already mentioned above, the product $p \times d = 0.05 - 0.5$ mbar $\times$ mm is preferred. Thus, as also mentioned above, at an electrode distance d of 1 mm and hydrogen gas with a low pressure of 0.5 mbar inside the electrodes meet this criterion.

From the borehole 5 of cathode 1 exits an electron flow 9 and from the borehole 5 of anode 1' exits the electron flow 10. The insulation 4 protects the outer edges 3 of the electrodes among each other and in view of the respective other electrodes against gas-discharges.

With the above-given equation, under consideration of the geometric conditions of the particle accelerator, it is possible to establish the voltage under which it breaks down to the explained spark-like gas-discharge. In some situations, the outflow opening for the ion-flow is not required, for example, in a neutron generator formed by the electrodes, whereby a target is producing neutrons under ion-bombardement in the path of beams within the electrodes.

It is recommended to produce the electrodes out of metals which have little tendency of sputtering, for example, tantalum or aluminum. With the present invention, as tests have proven, it is possible during discharge of the natural capacitance of the particle accelerator, formed by the electrodes, to obtain 100 A electron flow and 10 A ion flow at voltages between 5 to 20 KV for the duration of a few nano-seconds. During a periodic discharge of such a system, frequencies of up to about 1 MHz can be obtained.

Figure 2:
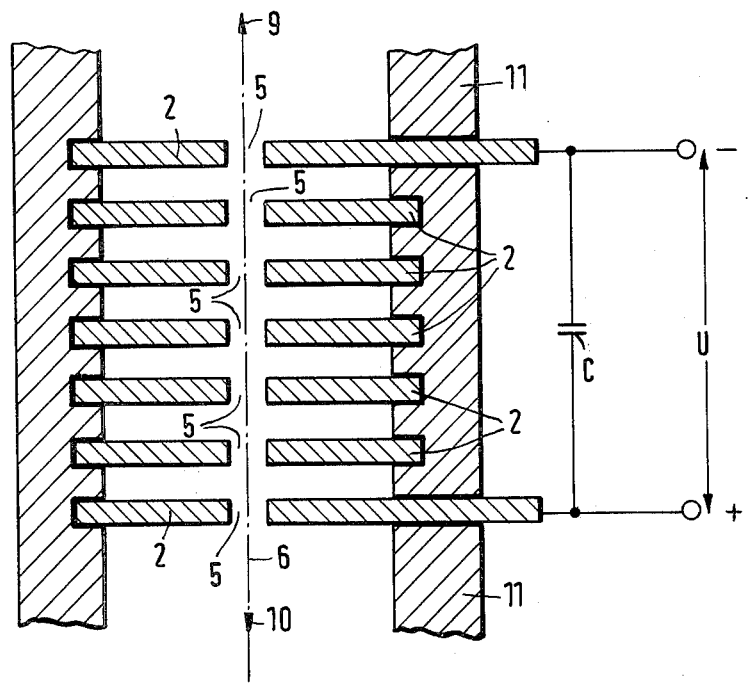
FIG. 2 is a cross-sectional view of an improvement of the FIG. 1 device.

Since in many applications of the present invention (see the later explained embodiments) not only high strengths of currents but also very high voltages of the out-flowing particles are required, it is recommended according to FIG. 2 to provide a greater, randomly electable number of electrodes 2. In this example, the two outermost of the electrodes 2 are connected to the voltage U. Additionally, an external condensor C may be provided for increasing the capacity. In general, the same reference numerals as in the embodiment of FIG. 1 hold true here. Only the insulating housing is herein different according to FIG. 11, where it extends beyond the outer walls of the electrodes. Also in this embodiment there is recommended a circular or cylindrical form of the electrodes and the housing. At a corresponding voltage U there takes place a continuous gas-discharge, whereby, however, the plasma in the vicinity of the (fictive) opening- or borehole-axis contracts itself still more sharply.

Figure 3:
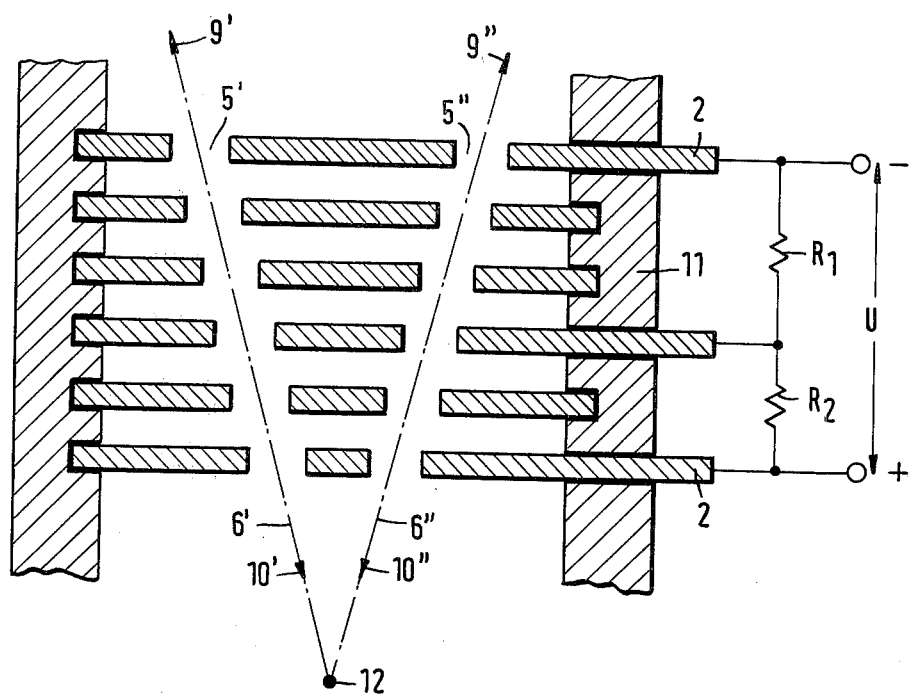
FIGS. 3 and 4 are cross-sectional views showing further embodiments with a multitude of discharge channels.

FIG. 3 shows also a multitude of planar-parallel electrodes, whereby only each outermost electrode 2 is enumerated. All electrodes are located within the insulating housing 11, whereby, however, a further potentiometer consisting of the resistor R1 and R2 is proposed. There exist here furthermore two rows of openings or boreholes 5' and 5" which form two discharge channels 6, 6". Two electron-flows 10', 10" are thusly meeting in a mutual point 12, whereby there is obtained a correspondingly large energy-density. The exiting ion-flows are indicated by numerals 9', 9".

Figure 4:
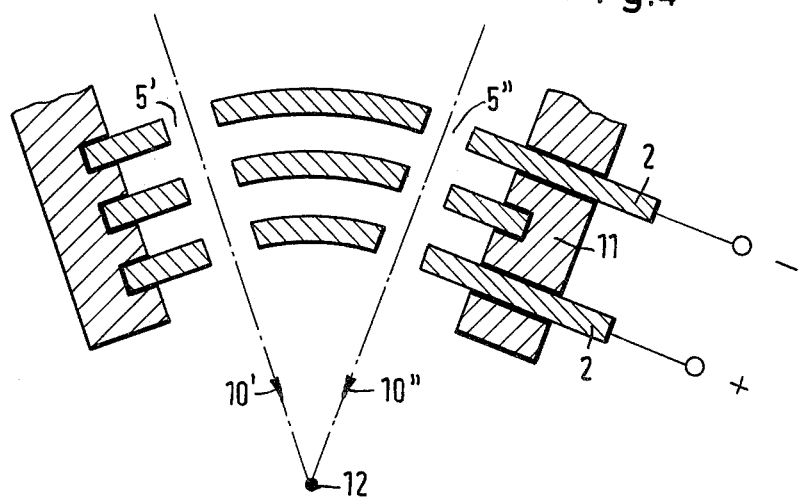

FIG. 4 shows a variant similar as FIG. 3. The electrodes 2 have here the identical distance. They are however concentrically curved towards point 12 in which are meeting the electron-flows 10', 10".

In all above-mentioned embodiments, there may be provided voltage dividers and/or external capacities. A particle accelerator according to the present invention comprising one or a plurality of electrodes also operable without voltage applied to the interim electrodes. The values for the interim electrodes, which are located between the outer electrodes, develop by themselves due to the geometric arrangement and the discharge. It is necessary to retain the insulation therebetween however (see FIG. 2). The electrode input lines, i.e., the electrodes extending from the housing, must be cemented together with the recesses of the housing. The dielectric strength, i.e., the voltage required for the gas-discharge, in a system comprising more than two electrodes is correspondingly higher than in a dual-electrode system. As long as the diameters of the openings or boreholes 5 and the electrode-density are retained approximately in a size-order such as the electrode distances d, the gas discharge system produces practically no limitation with regard to the number of electrodes and therewith the voltage. Under the verbage "approximately in a size-arrangement" is thereby understood that the dimensions of the above-mentioned parts may deviate up to approximately the factor 3. In this manner, it is possible, by means of suitable series-switching—ultimately under utilization of suitable voltage dividers—in systems comprising many electrodes, to obtain acceleration voltages for particles up to multiple million volts (V). Tests have proven that the diameters of the exiting ion- and electron-flows are generally substantially smaller than the diameters of the boreholes or holes 5, and thereby in general are one third of the borehole diameter. This condition is due to a magneto-hydrodynamic consolidation of an electron-flow in the low pressure gas (effect of the so-called self-focusing). This diameter enlarges itself not substantially when external condensators are switched thereto, however, the flow-strengths increase substantially, e.g. up to several thousand amperes (A). It is anticipated that this value can be increased so that flow densities of the electron-flow of up to $10^8$ A/mm$^2$ can be reached. The exiting ion-flows are smaller by about one size-order. The timely duration of discharge is of the size order of a few nano-second, whereby, however, a practically constant effect develops due to the constant pulsation of such flows with a relatively high frequency, for the application of the present invention as disclosed hereinbelow.

Figure 5:
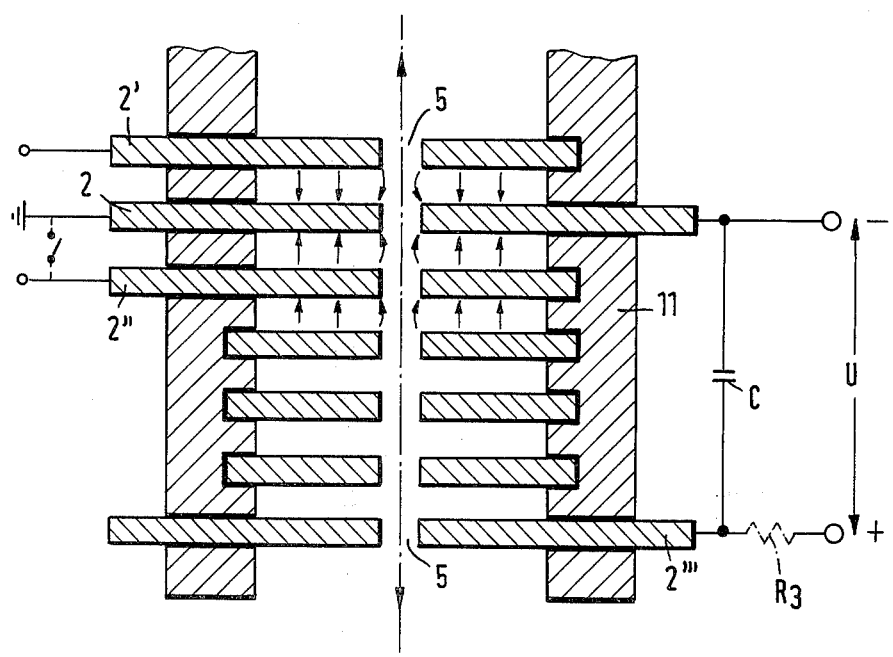
FIG. 5 shows a cross-sectional view of a particle accelerator with a trigger ignition.

FIG. 5 shows a trigger-switching according to which the upper electrode 2' can be placed onto the positive and the lower electrode 2'' can be placed onto the negative trigger-voltage, while the central electrode 2, which here forms the cathode, is grounded. Downwardly-connected are a plurality of electrodes, of which the electrode 2''' forms the anode. The trigger-voltage would however also be connectable to each of the other electrodes. Due to this artificial ignition by means of switching a trigger-voltage with the voltage U already existing at the anode and at the cathode, the ignition point can be determined very precisely. This is then of importance when a plurality of particle accelerators should be ignited simultaneously (see for example FIG. 10). The timely precision with which the trigger-process becomes effective can be increased when in the anode- or cathode-chamber (so-called front chamber) there burns a continuous luminous current. The energy may be supplied to the electrodes and the capacity C by means of a resistance RC, indicated by the broken line. A periodic discharge is possible, in order to obtain pulsated electrical energy for technical purposes, so that the total system may be utilized as an "electrical switch", whereby the period is regulatable by changing the trigger frequency.

Figure 6:
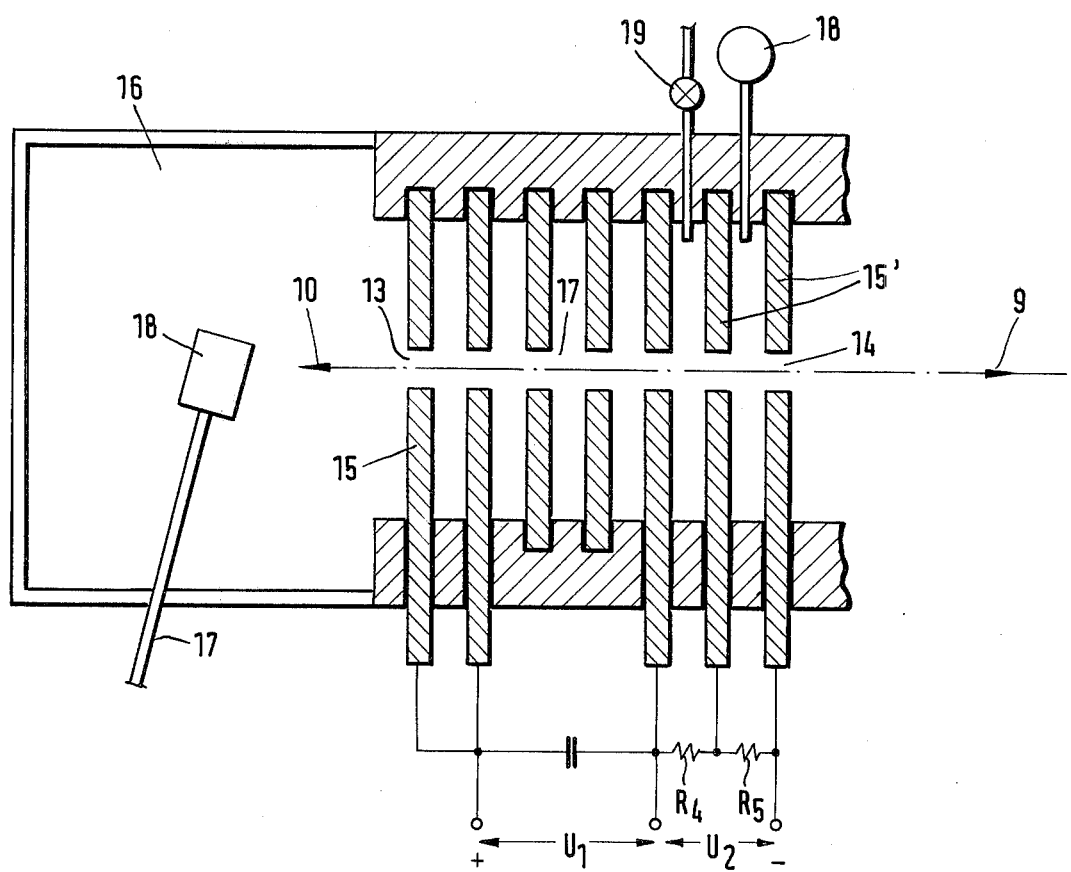
FIG. 6 shows in a cross-sectional view a further switch-possibility of a particle accelerator according to the invention with a device for preparing objects.
Figure 7:
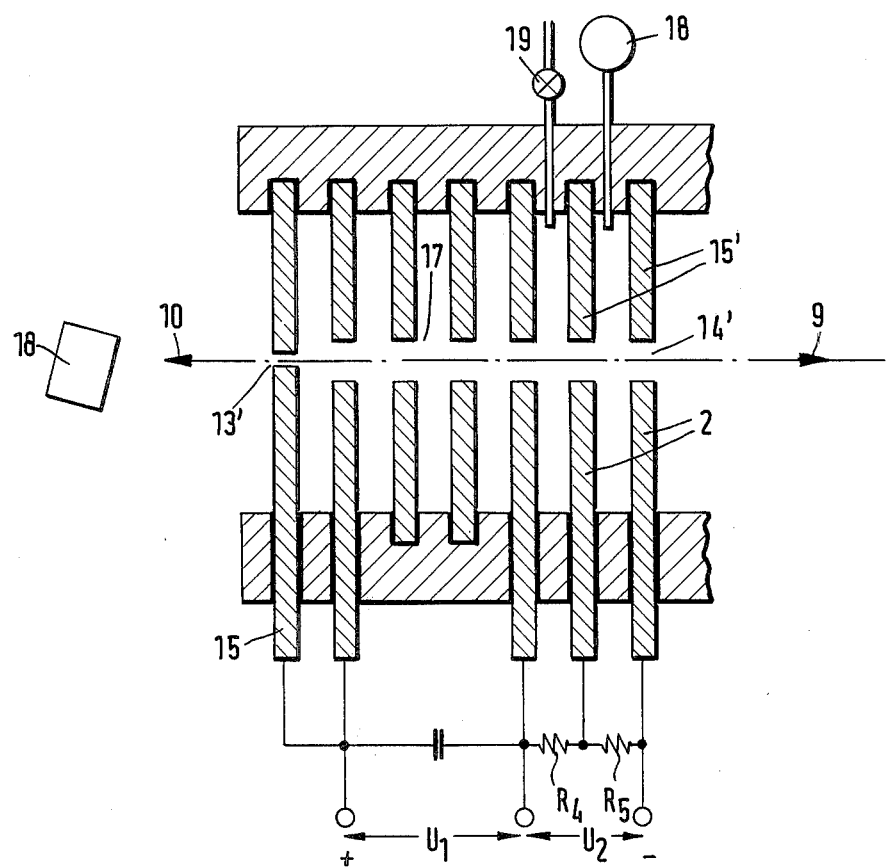
FIG. 7 shows the arrangement according to FIG. 6 with the preparation of objects located outside the low-pressure area.

FIGS. 6 and 7 show arrangements comprising a plurality of electron plates representing the source for ions and electrons. A voltage U1 on the anode-side is provided with voltage U2 at the cathode side further accelerating the particles, so that an intensified electron beam 10 as well as an also intensified ion beam 9 exits at the respective opening 14, 13. The voltage U2, which serves for the postacceleration of the ions, lies at the electrodes 15' of the cathode-side, and may be formed by the voltage-dividers R4, R5.

In the embodiment of FIG. 6, there exists in the electrode 15 at the anode-side an exit opening 13. Adjacent thereto is a chamber 16, in which, by means of a holder 17, serviceable from the outside, a workpiece 18 is retained in the electron-beam 10 and which can be treated by the same. In chamber 16 and in the inner space 17 of the particle accelerator, the low pressure is retained by means of a pump 18. Numeral 19 designates the gas-supply. The electron-flow, or also an exiting ion-flow, may be utilized for the production of boreholes, for milling, for removing of materials, or for melting, or evaporation of materials. It is understood that also a plurality of electrodes 2 above those shown in the drawing, could be provided. This holds also true for the remaining embodiments.

In the embodiment of FIG. 7, the chamber 16 is not being utilized. The outer anode plate 15 is constructed as a restrictor, whereby the opening 13' has a correspondingly small diameter. It forms, for the outside atmosphere, a flow-resistance which is so great that the low pressure in the particle accelerator can be retained without difficulty by means of pump 18. The electron-beam 10 serves for treating a part 18 which lies outside the particle accelerator in the normal atmosphere. The ion-flow exits at 14'.

Figure 8:
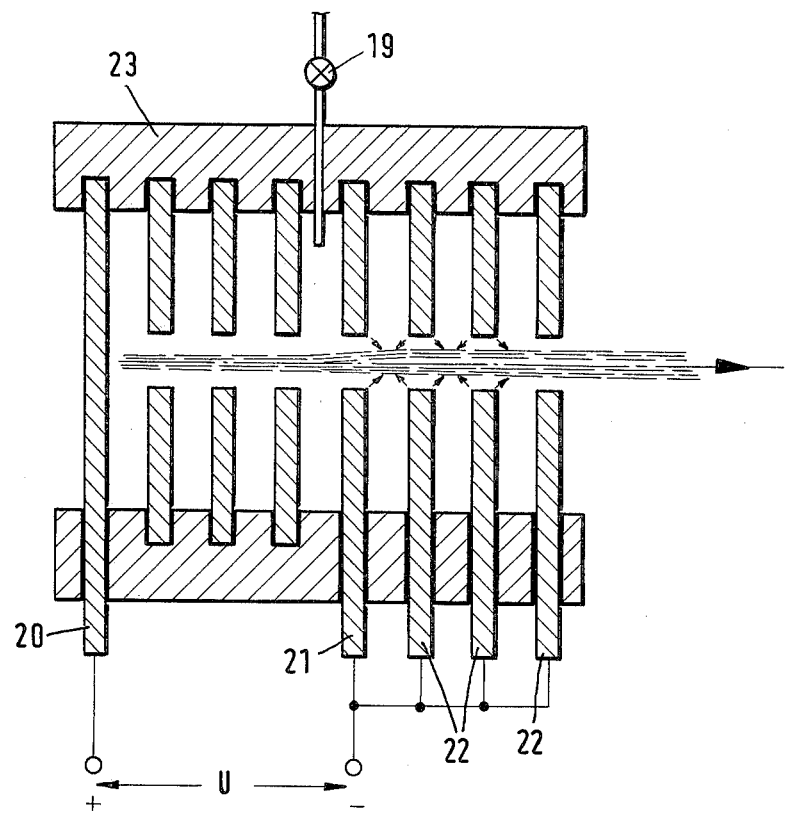
FIG. 8 shows in cross-section an embodiment of the invention for obtaining a particle flow which is substantially neutral.

The embodiment of FIG. 8 shows a particle accelerator which is also open toward the cathode-side, whereby however the voltage U lies only between the anode 20 and the cathode 21. Adjacent this cathode 21 is a series of electrodes 22 at the exit-side situated at the right in the drawing, placed on the potential of electrodes or cathodes 21.

Due to these electrical neutral drift paths there results a neutral particle flow of electro-plasma and ions having a high particle volume. This may, for instance, be utilized as propulstion of an ion-rocket, whereby the housing 23 is built into the ion-rocket, or is formed by the same. There is no pump required in this case since the pressure of the outer space into which the beam flows is equal to 0. Sufficient gas-supply should be provided.

Figure 9:
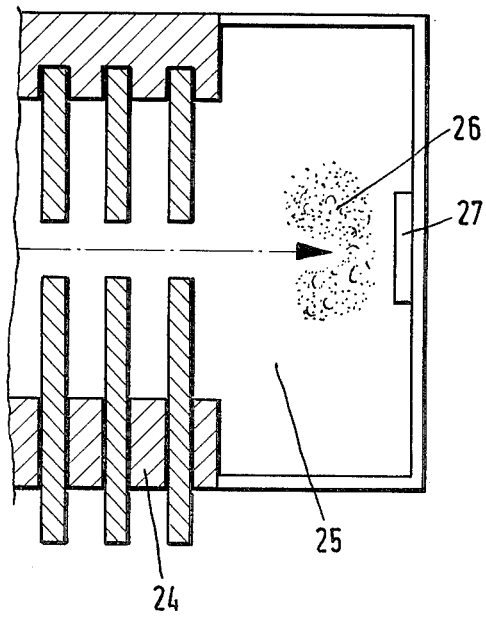
FIG. 9 is a cross-sectional view of a further variant of the invention for effecting a nuclear reaction.

FIG. 9 shows a particle accelerator wherein parts which are of no interest have been eliminated, whereby the ion-flow 25 exiting from the cathode 24 contacts either a gas 26, for example deuterium, or a material 27, for example beryllium to release there a neutron-emission. The ion-flow is here being utilized for the nuclear reaction.

Figure 10:
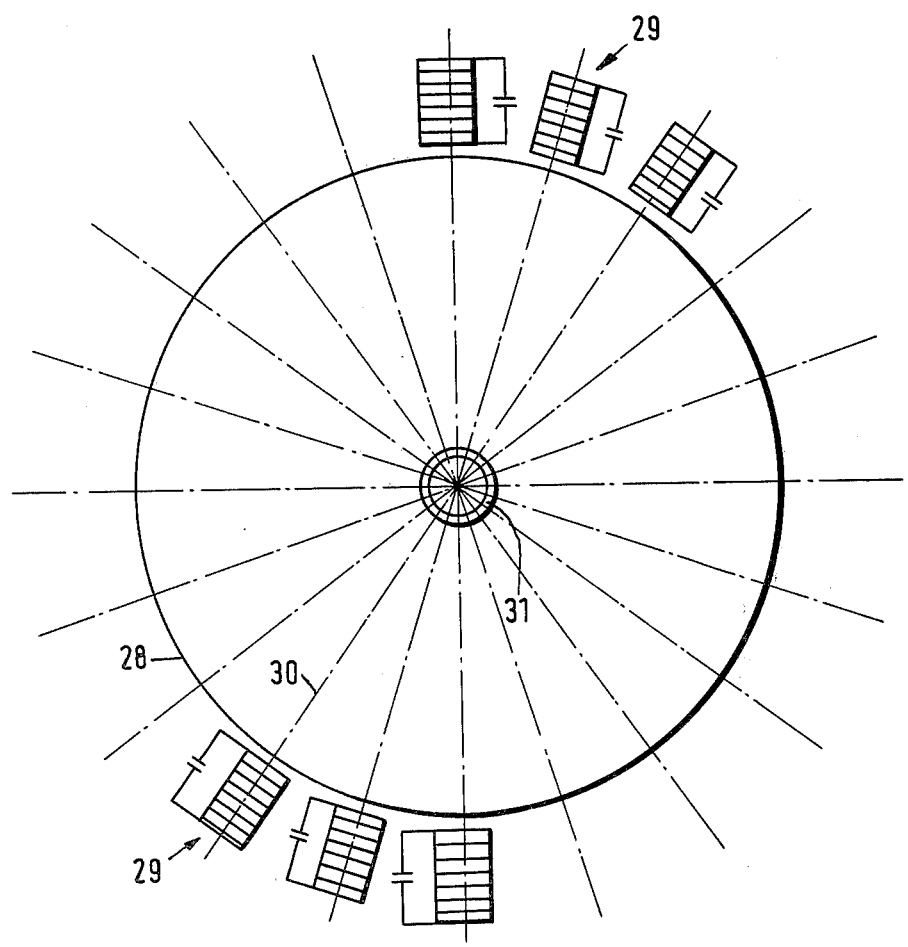
FIG. 10 is a cross-sectional view of an embodiment of the invention for effecting a nuclear fusion.

FIG. 10 shows an arrangement of a plurality of particle accelerators on a spherical bowl or a support member 28 which corresponds to a spherical bowl. It represents a three-dimensional arrangement of particle accelerators 29 having their gas-discharge channels 30 directed towards a fusion-pellet 31, which is located at the center point of the bowl. This may comprise a thin gold-bowl within which is located a so-called target. Since the electron beams are stopped by the gold bowl, temperatures of 100 million °C., which are necessary for nuclear fusion, can develop in the target. The member 31 is known in itself, it represents pellet-fusion. Unknown however is the production of the energy of electron-beams according to the present invention.

Figure 11:
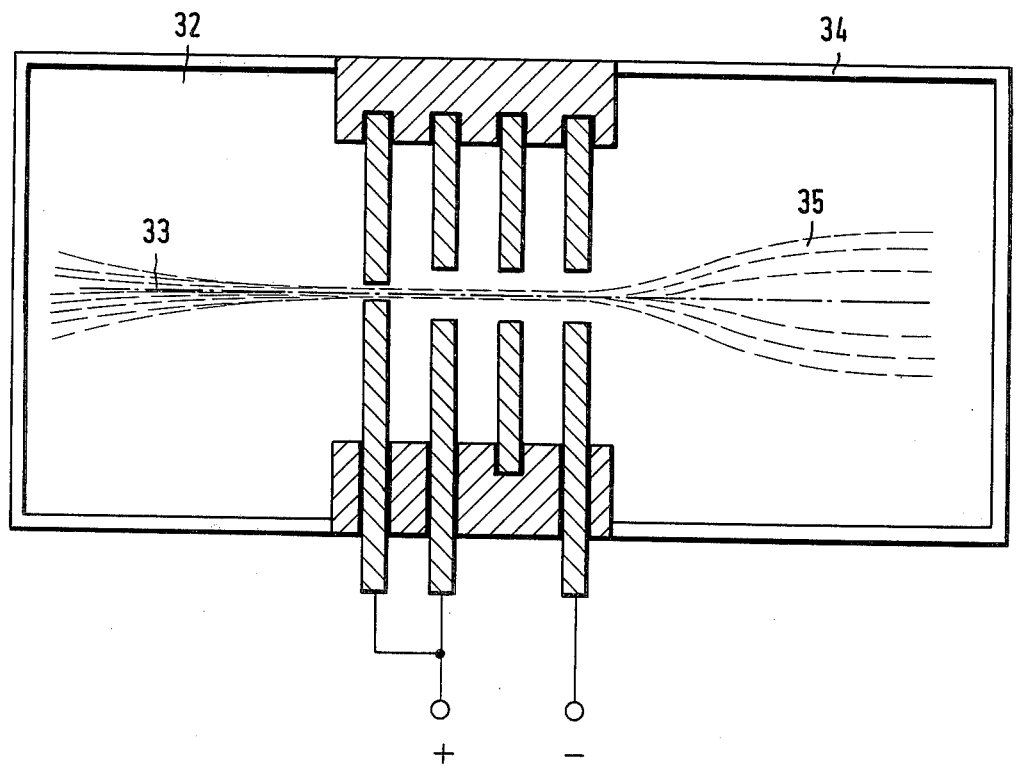
FIG. 11 shows in cross-section an embodiment of the invention for producing a light source.

According to FIG. 11, a chamber 32 filled with gas is located at the electron-exiting side, whereby the gas content is brought to glow by means of the electron flow 33. There may also be a chamber 34 at the ion-exiting side, and be filled with a gas which is brought to glow by means of the ion-flow 35. The gas is always a high-pressure gas, for example xenon. It is hereby possible to produce a pulsated light source for pumping up laser beams.

Figure 12:
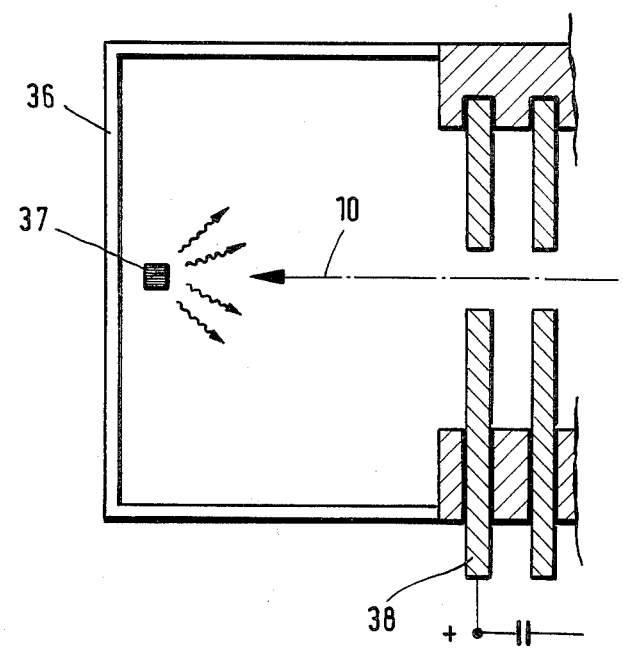
FIG. 12 shows a cross-sectional view of an embodiment of the invention for producing X-ray beams.

FIG. 12 shows in addition to the electrode 38 at the anode-side a housing 36 with a brake-anode 37, which is stimulated to emit X-ray beams due to the impact of the electron-beam 10.

The characteristics disclosed in the examples of embodiments, for example switches, may analogously also be provided for the other embodiments and vice-versa.

We claim:

1. An apparatus for producing and accelerating electrons and ions under the application of a voltage, said apparatus comprising:

electrode means comprising at least two spaced electrodes, each of said electrodes including a peripheral region and an interior region and means defining at least one aperture in said interior region, said means defining at least one aperture being aligned at each electrode and defining a gas-discharging path;

gas supply means for providing an ionizable low pressure gas in said gas-discharge path;

insulator means for preventing a spark-like gas-discharge between said electrodes at the peripheral regions of said electrodes; and further means for producing separate and oppositely-directed accelerated flows of ions and electrons, respectively, along said gas-discharge path, said further means comprising voltage supply means connected to said at least two electrodes, for establishing an electrical potential therebetween such that a high current spark-like gas-discharge occurs in said ionizable gas concentrated along said gas-discharge path;

wherein the product of the pressure in mbar of the ionizable gase and the distance between the two spaced electrodes in mm is in the range of 0.05 to 0.50 mbar×mm, and wherein said electrical potential is at least approximately five kilovolts.

2. The apparatus of claim 1 wherein said voltage supply means supplies a potential to said electrodes which is inversely proportional to the cube of the product of the gas pressure and the distance between said electrodes.

3. The apparatus of claim 2 or 1, wherein said electrodes are planar and parallel with respect to each other.

4. The apparatus of claim 2 or 1 wherein said means defining at least one aperture defines at least two apertures in each of said electrodes, said apertures being aligned to define at least two convergent gas-discharge paths.

5. The apparatus of claim 1 or 1 wherein there is provided a trigger means connected to at least two electrodes for time wise triggering said spark-like gas-discharge.

6. The apparatus of claim 1 or 1 wherein one of said electrodes is an anode and another is a cathode.

7. The apparatus of claim 6 wherein additional electrodes are provided with the cathode separating said additional electrodes from said anode and a negative voltage supply means connected to said additional electrodes for the purpose of accelerating ions flowing from said anode towards said cathode.

8. The apparatus of claim 6 wherein additional electrodes are provided with the anode separating said additional electrodes from said cathode and a positive voltage supply means connected to said additional electrodes for the purpose of accelerating said electrons flowing from said cathode towards said anode.

9. The apparatus of claim 6 wherein adjacent said anode there is provided a chamber filled with low pressure gas, said chamber including a holder means for supporting a work piece for treatment.

10. The apparatus of claim 6 wherein adjacent the anode there is provided a terminal electrode means, having a small outflow opening, for constricting the electron flow.

11. The apparatus of claim 6 wherein additional electrodes are provided adjacent the cathode and have a potential applied thereto equal to that of an electrode in the center area of the accelerator such that an extensively neutral particle flow is produced.

12. The apparatus of claim 11 wherein the neutral particle flow is utilized in an ion-rocket and means are provided for electrically neutralizing said ions prior to their exit from the ion-rocket engine.

13. The apparatus of claim 6 wherein adjacent said cathode there is provided a chamber for the containing of a material which produces neutrons under the application of ions traveling along said spark-like gas-discharge path.

14. The apparatus of claim 1 wherein there is additionally provided means for mounting target material along said spark-like gas-discharge path, for releasing the heat of thermo-nuclear fusion.

15. The apparatus of claim 14 wherein a plurality of particle accelerators are arranged around a covered spherical bowl such that a central point in said spherical bowl is along the gas-discharge paths of each particle accelerator and a target means is provided at the central point of the spherical bowl, said target being covered by thin metallic skin.

16. The apparatus of claim 1 wherein said gas becomes luminous during said spark-like gas-discharge.

17. The apparatus of claim 6 wherein adjacent said anode, there is located a means for emitting X-ray beams when bombarded with electrons.

18. A method for producing and accelerating ions and electrons in response to an applied voltage, said method comprising the steps of:

providing a low pressure ionizable gas in a discharge path extending substantially linearly through apertured interior portions of plural space electrodes;

insulating the peripheral portions of said spaced electrodes from one another to prevent spark-like gas-discharges between said peripheral portions; and creating a spark-like gas-discharge in said ionizable gas, concentrated along said gas-discharge path, by applying a voltage between at least two of said electrodes, to produce separate accelerated flows of electrons and ions in opposite directions along said gas-discharge path;

wherein the product of the pressure of the ionizable gas in mbar and the distance between the spaced electrodes in mm is in the range from 0.05 to 0.50 mbar×mm, and wherein said applied voltage is at least approximately five kilovolts.

19. The method according to claim 18, wherein the pressure of said ionizable gas is on the order of 0.5 mbar.

20. The method according to claim 18, wherein the spacing between adjacent ones of said plural spaced electrodes is approximately one mm.

21. The method according to claim 18, wherein said spark-like gas discharge has a duration of only a few nanoseconds.

22. The apparatus according to claim 1, wherein the pressure of the ionizable gas is approximately 0.5 mbar.

23. The apparatus according to claim 1, wherein the spacing between said at least two spaced electrodes is approximately 1 mm.

* * * * *